(12) United States Patent
Renous

(10) Patent No.: US 6,703,898 B2
(45) Date of Patent: Mar. 9, 2004

(54) DIFFERENTIAL AMPLIFIER COMPRISING AN UNLOCKING DEVICE

(75) Inventor: Claude Renous, Grenoble (FR)

(73) Assignee: STMicroelectronics SA, Montrouge (FR)

( * ) Notice: Subject to any disclaimer, the term of this patent is extended or adjusted under 35 U.S.C. 154(b) by 28 days.

(21) Appl. No.: 10/144,636

(22) Filed: May 13, 2002

(65) Prior Publication Data

US 2002/0167357 A1 Nov. 14, 2002

(30) Foreign Application Priority Data

May 14, 2001 (FR) .......................................... 01 06302

(51) Int. Cl.$^7$ ................................................ H03F 3/45
(52) U.S. Cl. ...................... 330/253; 330/257; 330/258
(58) Field of Search ................................ 330/253, 254, 330/257, 258; 327/359

(56) References Cited

U.S. PATENT DOCUMENTS 5,087,830 A * 2/1992 Cave et al. ............... 307/296.6
6,556,081 B2 * 4/2003 Muza ......................... 330/253
6,586,995 B1 * 7/2003 Tachibana .................... 330/253

\* cited by examiner

*Primary Examiner*—Henry Choe
(74) *Attorney, Agent, or Firm*—Lisa K. Jorgenson; Allen, Dyer, Doppelt, Milbrath & Gilchrist, P.A.

(57) ABSTRACT

A differential amplifier may include a first stage including a first transistor and a second transistor having the same polarity and assembled to constitute a differential amplifier. The first stage may be supplied by first and second mirror current sources. The differential amplifier may further include a common mode control circuit, which may include two inputs receiving a reference voltage VCM and a common mode voltage controlling the first and second mirror current sources, respectively. The differential amplifier may further include a Miller gain stage having inputs and for a setting gain-band product. The differential amplifier may further include an unlocking circuit, inserted between the common mode voltage and the Miller gain stage inputs, to cause the Miller gain stage to conduct on circuit start-up.

31 Claims, 3 Drawing Sheets

DIFFERENTIAL AMPLIFIER COMPRISING AN UNLOCKING DEVICE

FIELD OF THE INVENTION

The invention relates to semiconductor amplifier circuits and, more particularly, to a differential amplifier circuit with an unlocking device.

BACKGROUND OF THE INVENTION

Differential amplifiers are widely used in the telecommunications field. They allow for processing of weak signals conveying voice signals, and, more generally, data. A differential structure is particularly preferred in data transfer networks of wired networks (Wide Area Network) found in Asynchronous Transfer Mode-type (ATM) networks or Asynchronous Digital Subscriber Line-type (ADSL) networks as well as their principal derivatives HDSL (commonly designated by the generic term XDSL).

Generally, a differential structure has the effective advantage of eliminating harmonics and second-order non-linearities in distortion noise. Furthermore, a differential structure ensures greater immunity to common mode interference, such as the interference that power supply circuits of electronic circuits experience. Differential amplifier circuits, particularly those using complementary-type MOS type transistors, which are used in bi-CMOS technology, frequently use power supply sources. Such power supply sources often experience difficult start-up transients and blocking phenomena preventing the amplifier from operating.

Circuits for overcoming this problem and avoiding power supply source blocking in a semiconductor circuit are known. French patent application No. 2,767,976 entitled "Dispositif d'aide au démarrage pour une pluralité de sources de courant" discloses such a start-assisting device. The start-assisting device which, though not specifically adapted to an amplifier structure, is useful to supply devices for microprocessors and electronic apparatus. This device comprises a start-assisting device, which provides power supply sources with a start current for a transient period, until a steady state can be established. A complementary inhibiting device is thereafter required for steady-state operation.

Although differential amplifiers are especially important in integrated circuits used in telecommunications, it is still desirable to design start-assisting devices that are particularly adapted to their structure and can be easily and cost-effectively manufactured without requiring the addition of new circuits. However, a differential amplifier structure that directly and easily incorporates a suitable unlocking circuit is not yet available.

SUMMARY OF THE INVENTION

The invention is aimed at providing a differential amplifier structure having an efficient, simple unlocking device, which only requires the addition of a very limited number of other components.

Another object of the invention is to provide an unlocking device which is adapted to the architecture of a differential amplifier to be integrated into an integrated circuit, and, in particular, that uses CMOS-type components of bi-CMOS technology.

Another object of the invention provides a differential amplifier structure, which is adapted to telecommunication network requirements and, particularly, ADSL or HDSL-type links.

The invention achieves these objects through a differential amplifier structure having a first stage including first and second transistors of identical polarity, such as NMOS-type transistors, which are assembled to provide a differential amplifier. The first and second transistors are fed by first and second mirror current sources respectively, which are controlled by a control circuit supporting common mode. The common mode control circuit has two inputs receiving a reference voltage $V_{CM}$ and a voltage representative of the common mode voltage of the amplifier.

A second Miller stage comprises third and fourth transistors of an opposite-type from the former transistor, for example PMOS. The inputs of the third and fourth transistors receive output signals from the first stage, which are used to increase the open loop gain of the amplifier circuit and to set the gain-bandwidth product of the amplifier. An additional unlocking circuit is inserted between the common mode voltage and the Miller stage inputs. The additional unlocking circuit causes controlled conduction of the third and fourth PMOS-type transistors until the common mode voltage reaches a value which is significantly close to the reference value.

Thus, it is ensured that the Miller stage is set for conducting and, hence, the first and second current sources are set for conducting, which ensures the amplifier operation. Once the common mode voltage rises back up to a normal operational value, the unlocking circuit locks and re-establishes impedance between the Miller stage output and the common mode voltage, thereby enabling the amplifier to operate in a linear mode.

Preferably, the unlocking circuit is provided by two MOS-type transistors causing short-circuiting between the common mode voltage and the Miller stage inputs. The drain terminal of each NMOS transistor (which can also be NPN transistors) or unlocking transistor is connected to a corresponding gate of one of the third and fourth transistors. Furthermore, both unlocking transistors have a source connected to the terminal representative of the common mode voltage. The gates of the unlocking transistors are connected to a reference voltage $V_{CM}$ and cause the Miller stage transistors to conduct when the true value of the common mode is significantly smaller than the reference value $V_{CM}$.

In a particular embodiment, the amplifier may comprise a cascade stage comprising, for instance, bipolar transistors. More particularly, the differential amplifier may comprise a first stage comprising a first and a second NMOS-type transistor (which can also be NPN-type transistors) assembled as a differential pair. The gates of the first and second NMOS-type transistors may receive input signals via feedback resistors from a common source connected to a third current source.

The differential amplifier may further comprise a second Miller gain stage comprising third and fourth PMOS-type transistors, for example. The third and a fourth PMOS-type transistors may be assembled as a common source, each associated with a current source and a capacitor. The second Miller gain stage output may be connected to output terminals and having one input.

The differential amplifier may further comprise fifth and sixth PMOS-type transistors, for instance. The fifth and sixth PMOS-type transistors provide the first and second current sources, respectively, feeding the first and the second NMOS-type transistors, which form the differential pair of transistors. The fifth and sixth transistors may be assembled as a common source and each having a drain. The drains of the fifth and sixth transistors are connected to corresponding drains of the first and second transistors in the differential pair, as well as a gate controlled by the common mode supporting circuit.

The differential amplifier may further comprise an unlocking circuit comprising seventh and eighth NMOS-type transistors, for example, having gates that receive a reference value $V_{CM}$. The unlocking circuit may short-circuit the common mode voltage and the gates of the third and fourth transistors, which form the Miller stage when the common mode voltage goes below the reference value $V_{CM}$.

The invention is especially adapted to designing wide-band amplifiers used in wired telecommunications networks, and, more particularly, to wired telecommunication networks found in the Asynchronous Digital Line Subscriber-type networks and their derivatives.

DETAILED DESCRIPTION OF THE PREFERRED EMBODIMENTS

Figure 1:
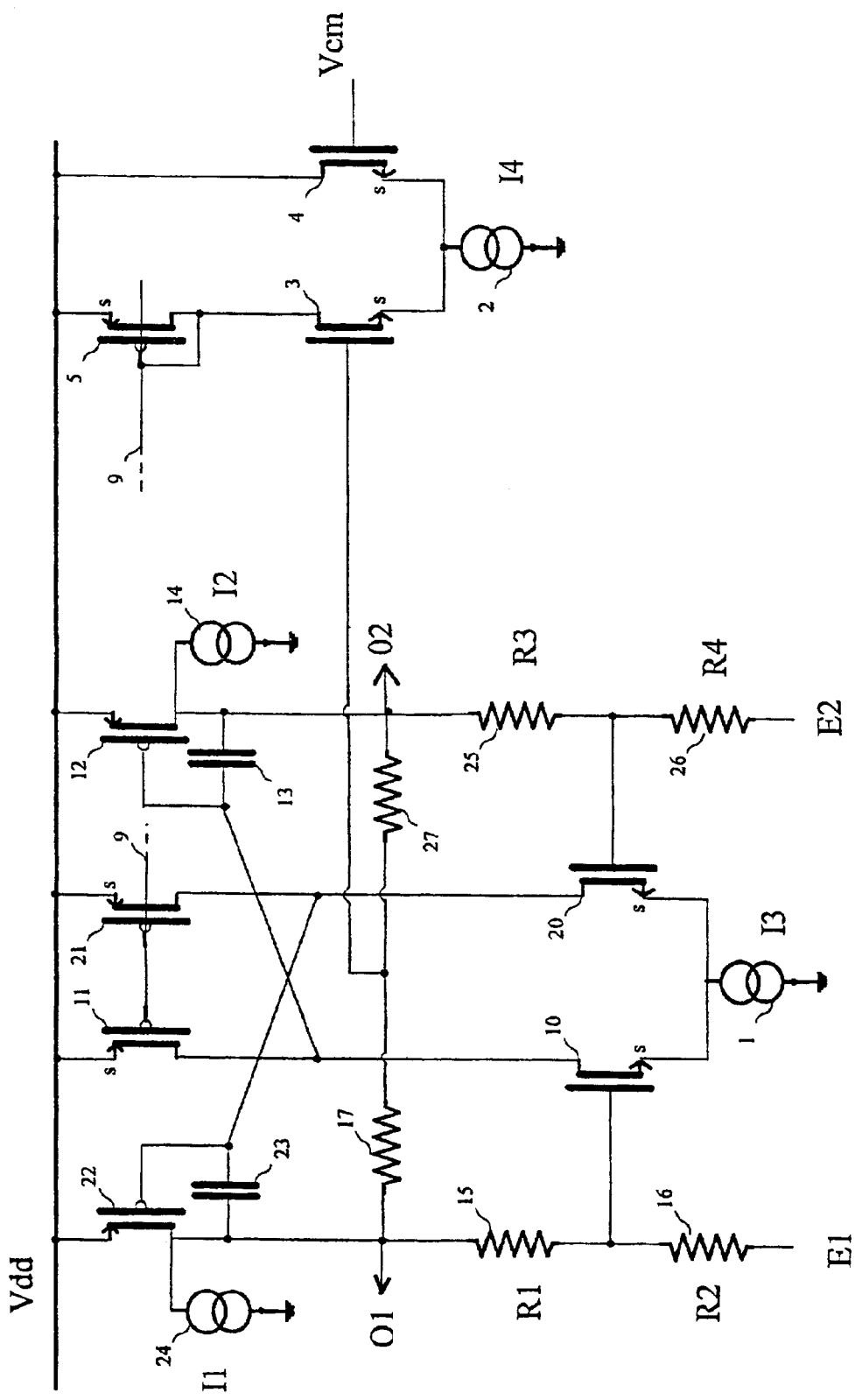
FIG. 1 illustrates an exemplary differential amplifier circuit comprising a Miller gain stage, which may be advantageously provided with an unlocking circuit, according to the present invention.

FIG. 1 illustrates an example of a differential amplifier comprising a Miller gain stage and which can be advantageously provided with the unlocking circuit described below. The differential amplifier comprises a pair of NMOS-type transistors 10 and 20. Although the preferred embodiment will describe the use of NMOS-type transistors to form the differential pair, it is clear that those skilled in the art will readily adapt the structure to an architecture in which the differential pair will be based on PMOS-type transistors. The amplifier is fed by a power supply source supplying a voltage $V_{dd}$.

The source electrodes of NMOS transistors 10 and 20 are connected to a current source 1 (I3) which, in turn, is connected to ground or other reference voltage. Each transistor of the differential pair 10 and 20 is fed through its drain by a current source based respectively on a PMOS transistor 11 and a mirroring PMOS transistor 21. The source and drain terminals of transistor 11 are connected to supply terminal $V_{dd}$ and to the drain terminal of transistor 10, respectively. The source and drain terminals of transistor 11 are connected to supply terminal $V_{dd}$ and to the drain terminal of transistor 20 respectively.

Transistors 11 and 21 are mounted in a current mirror configuration cooperating with a common mode supporting stage, which comprises a second differential pair associated with a current source 2 (I4) and a PMOS-type transistor 5. More particularly, the second differential pair comprises two transistors 3 and 4, sources of which are connected to a current source 2 (I4) which, in turn, is connected to ground. The drain electrodes of transistors 3 and 4 are connected to the drain of transistor 5 and supply terminal $V_{dd}$, respectively.

The gate of transistor 3 is connected to the midpoint of a resistive bridge, comprising two resistors 17 and 27 generally of equal values, the ends of which are connected to output terminals O1 and O2 of the differential amplifier. The bridge resistors 17 and 27 are used to obtain, at the midpoint, a potential representative of the common mode value of the differential amplifier outputs O1 and O2. The gate of transistor 4 receives a reference voltage, $V_{CM}$, which is used to set the common mode stage bias level and which is generally set to $V_{dd}/2$ to obtain a maximum dispersion output signal at terminals O1 and O2.

The gates of transistors 5, 11 and 21 are all connected together. The gate and drain of transistor 5 are connected to each other, thus ensuring it operates within the square zone of its characteristic I ($V_{GS}$). Thus, the transistors are mounted in current mirror configuration and a same drain current flows through them because, as they are substantially identical, they undergo the same variations of gate-source voltage $V_{GS}$.

The differential pair formed by transistors 10 and 20 is used as a first stage for a second Miller gain stage, which is comprised of a pair of PMOS-type transistors 12 and 22 assembled as a common source. More precisely, transistor 10 has its drain connected to the gate of transistor 12, the source of which is connected to supply terminal $V_{dd}$. Similarly, transistor 20 has its drain connected to the gate of transistor 22, the source of which is connected to supply terminal $V_{dd}$. Transistor 12 has its drain connected to a current source 14 connected in turn, at the other end, to ground. Similarly, transistor 22 has its drain connected to a current source 24 connected in turn, at the other end, to ground. The transistor 12 has its drain also connected to the output terminal O2 of the differential amplifier. Similarly, the transistor 22 has its drain also connected to the output terminal O1 of the differential amplifier.

A pair of capacitors 13 and 23 complete the Miller structure. The capacitor 13 is connected between the drain and source of transistor 12. Similarly, the capacitor 23 is connected between the drain and source of transistor 22. The capacitors are calibrated to set the gain-bandwidth product of the corresponding Miller stage. It is to be noted that the latter is designed to operate in class A, current sources 14 and 24 will therefore be calibrated accordingly to discharge the current in the amplifier load.

Associating the differential pair of transistors 10 and 20 and the Miller gain stage transistors 12 and 22 ensures a particularly high open loop gain for all of the amplifier and further helps to set its gain-bandwidth product. Feedback resistors 15 (R1), 16 (R2), 25 (R3) and 26 (R4) set the open loop gain to the desired value which is R1/R2=R3/R4. More precisely, as is shown in FIG. 1, resistors 15 and 16 together form a resistor bridge, the ends of which are connected to output terminal O1 and input terminal E1 of the differential amplifier, respectively. The midpoint of the resistor bridge is connected to the gate of transistor 10. Similarly, resistors 25 and 26 define a bridge, the ends of which are connected to output terminal O2 and input terminal E2 respectively, and the midpoint of which is connected to the gate of transistor 20.

As shown in FIG. 1, the common mode supporting circuit allows setting common mode voltages about the reference value, that is to say $V_{CM}=V_{dd}/2$. Indeed, it can be seen that should the potential of one of the outputs increase for any reason, for instance a circuit temperature rise, the increase would affect the midpoint of the resistive bridge 17 and 27, causing a corresponding voltage increase in the gate of transistor 3. A flow of current would then flow through transistor 3 because the additional gate voltage of transistor 4 would still be set to the unchanged value of reference $V_{CM}$.

Currents in transistors 11 and 21 would then be modified to cause the output voltage to go back to the reference value.

It is noted that, at start-up, such a circuit can stay locked because of blockage of the current sources embodied by transistors 11 and 21. As a matter of fact, at start-up, voltages at terminals E1, E2, O1 and O2 are all set to ground, which corresponds to a constant load. In such a case, current I4 delivered by source 2 is entirely derived only by transistor 4 and no current flows through transistor 3. All other transistors 5, 11, 21 are then blocked and the amplifier cannot operate. Similarly, source 1 stays blocked.

Even when the voltages at terminals E1 and E2 reach a suitable value, for example $V_{dd}/2$, because of the amplifier preceding stage receiving a steady load, for instance, transistor pair 10 and 20 may become blocked. This can be the case with some configurations of feedback resistor values R1, R2 and R3, R4, in particular, when the amplifier is used as a voltage attenuator. Therefore, having a common mode potential on both input terminals E1 and E2 may not be enough to ensure conduction of transistors 3, 5, 11 and 21 and allow the amplifier to operate in a linear mode.

To avoid a current source I1 blockage, which would impede the overall operation of the amplifier, a very simple and efficient unblocking device is incorporated which will now be described with reference to FIG. 2. For the sake of clarity, elements with common numerals from FIG. 1, will keep the same numerals in FIG. 2. The amplifier again comprises a differential pair of transistors 10 and 20, common mode supporting stage 3 and 4, and a Miller gain stage including transistors 12 and 22.

To ensure conduction of transistors 12 and 22, the circuit has an additional pair of NMOS-type transistors connected between the midpoint of the resistive bridges 17 and 27 to follow the level of output potentials O1 and O2 in common mode and, the transistor gates of the Miller gain stage. As a consequence, at start-up, the transistor gates enable conduction of the Miller stage. For that purpose, as shown in FIG. 2, a first NMOS-type transistor 18 is provided, the drain of which is connected to the gate of transistor 12, the source of which is connected to the midpoint of bridge resistors 17 and 27 tapping the common mode voltage.

A second NMOS-type transistor 28 having a drain connected to the gate of transistor 22 and a source connected to the midpoint of bridge resistors 17 and 27, measuring the common mode value, is also provided. The gates of both transistors 18 and 28 are common and receive the reference voltage $V_{CM}$. So when potentials of output terminals O1 and O2 are abnormally low, which is the case during start-up, NMOS-type transistors 18 and 28 are conductive and thus set corresponding Miller stage transistors 12 and 22 respectively to conduction. Therefore, a rise of the common mode potential is ensured. Consequently, a start-up current for transistor 5 and current mirrors formed by transistors 11 and 21 and finally in the differential pair of transistors 10 and 20, is also achieved.

Figure 2:
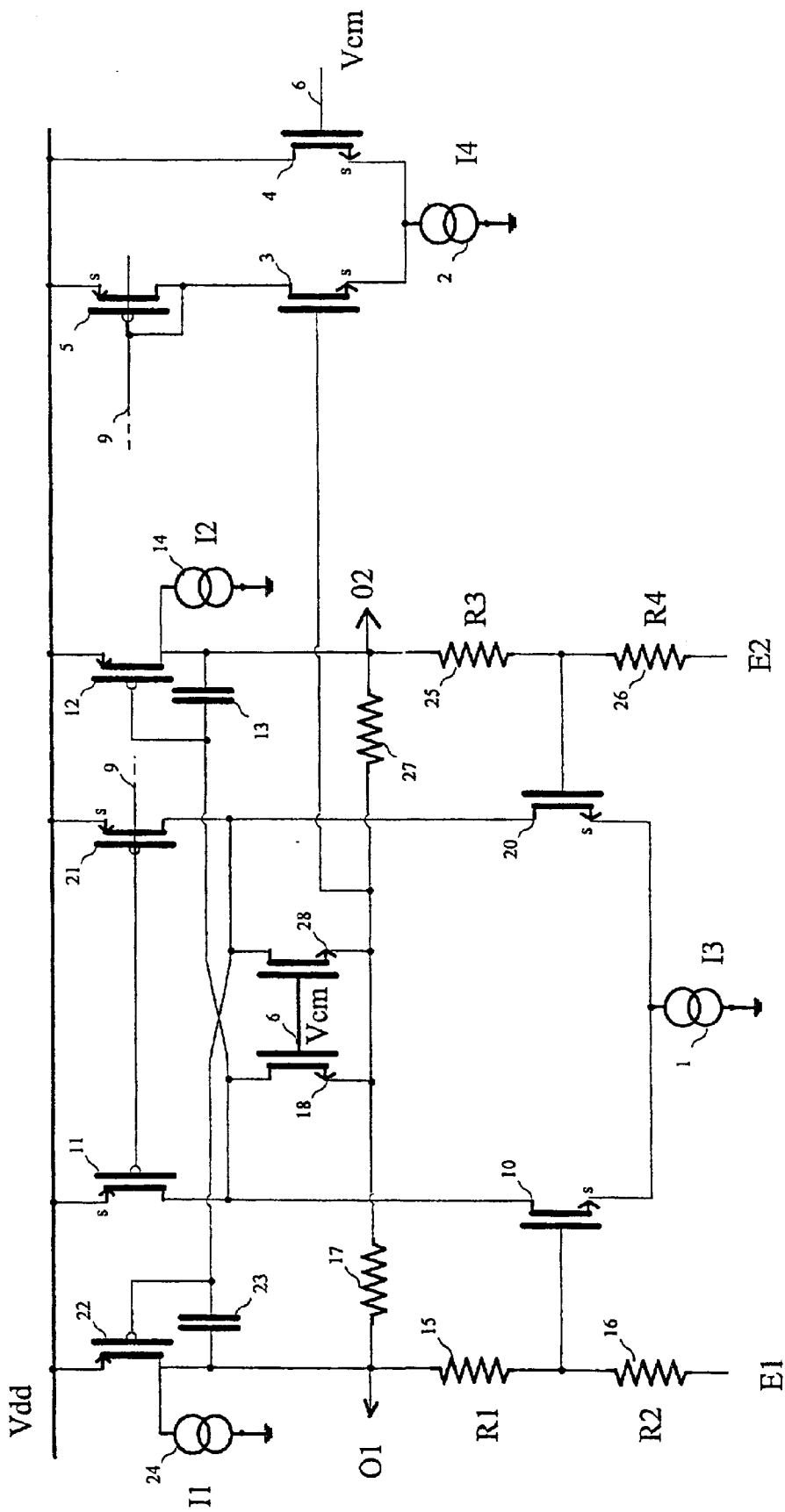
FIG. 2 illustrates a differential amplifier structure shown in FIG. 1 including the unlocking circuit, according to the present invention.

The disclosed unlocking circuit is found to be particularly efficient and, as is shown in FIG. 2, only needs two additional components. As a consequence, it can readily be incorporated in a semiconductor circuit. Further, it is noted that unlocking transistors 18 and 28 can be very small-sized transistors as a resistance amount of a few ohms is enough to ensure the Miller stage unlocking. Every differential amplifier can thus be provided easily and at a low cost with such a device, which automatically and simply self-inhibits as soon as a steady-state linear load is established. This represents an advantage over known unlocking systems.

Indeed it is noted that once the common mode potential reaches the reference value $V_{CM}$, both transistors 18 and 28 are blocked thus allowing the amplifier to operate in linear mode. Here, no additional inhibiting circuit such as those in known systems is necessary. This unlocking device is especially adapted to the realisation of differential amplifiers and to incorporation thereof in integrated circuits.

Figure 3:
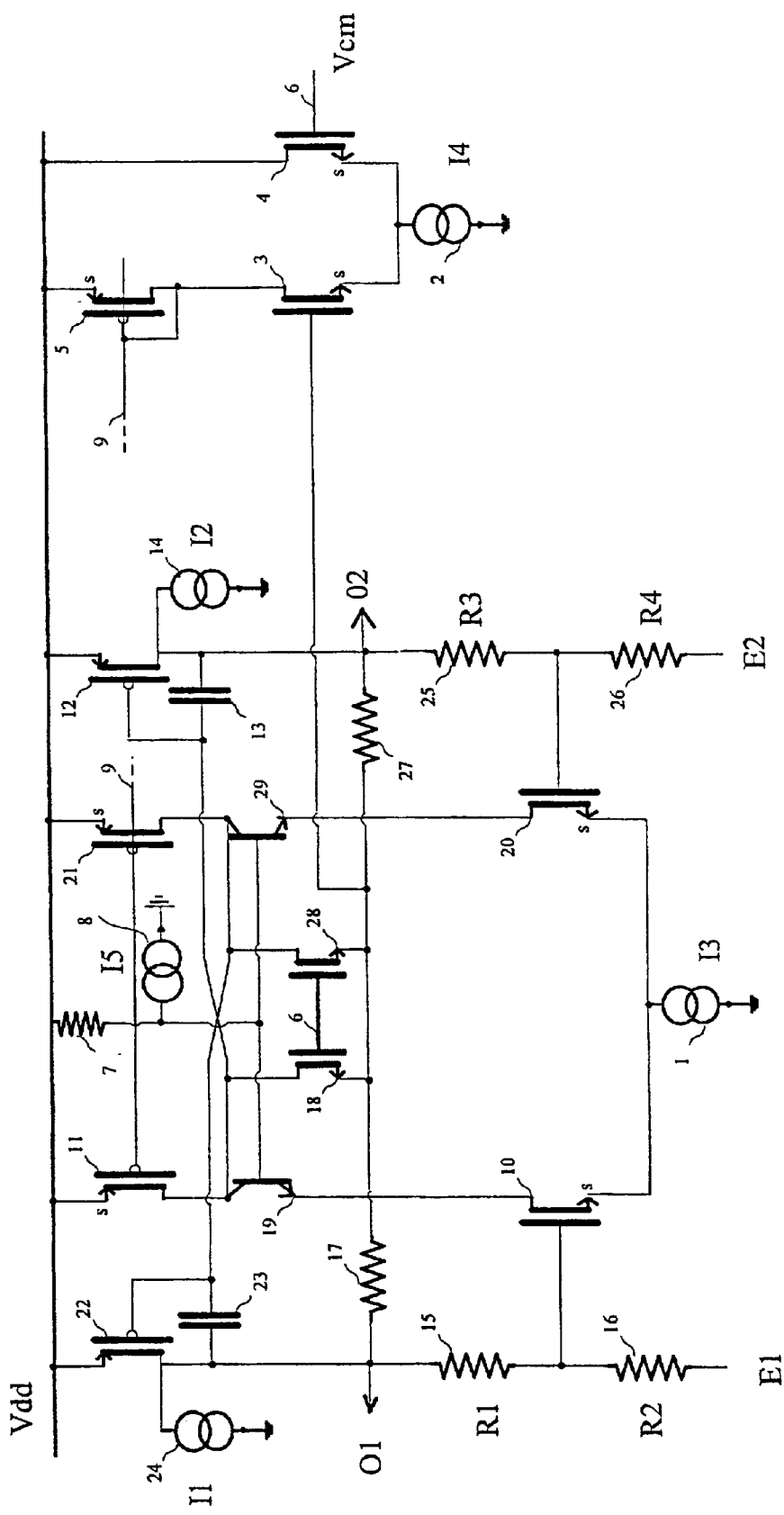
FIG. 3 illustrates a second embodiment of the differential amplifier shown in FIG. 2 including an additional cascade circuit, according to the present invention.

FIG. 3 shows another embodiment for a differential amplifier structure further comprising a cascade circuit forming an impedance adapter between a differential pair of transistors 10 and 20 and a Miller gain stage. In this embodiment, the transistor 10 drain electrode is not connected directly to the transistor 11 drain electrode. Rather, an NPN-type bipolar transistor 19 is interposed between transistors 10 and 11. More precisely, the transmitter and collector terminals of the NPN-type bipolar transistor 19 are connected to the transistor 10 drain terminal and the transistor 11 drain terminal, respectively.

Similarly, a bipolar transistor 29, also of NPN-type, is interposed between transistor 20 and transistor 21. More precisely, the transmitter and collector terminals of transistor 29 are connected to the transistor 20 drain terminal and the transistor 21 drain terminal, respectively. The bases of both transistors are connected to a resistor 7 dropping back to supply voltage $V_{dd}$ and to a current source 8, the opposite end of which is connected to a ground.

As will be apparent to people qualified in the art, the advantage of the cascade circuit is to provide large impedance at the first stage comprised of the pair of transistors 10 and 20 to further increase the amplifier's open loop gain. As can be seen, this disclosed amplifier circuit is perfectly adapted to bi-CMOS technology. Furthermore, note that any person qualified in the art could very easily adapt the structure in FIG. 3 to a cascade circuit comprised of NMOS-type transistors instead of bipolar transistors.

That which is claimed is:

1. A differential amplifier comprising:
    a first stage comprising
        first and second transistors of a first polarity connected together in a differential amplifier configuration,
        first and second current mirror sources for supplying current to said first and second transistors, respectively, and
        a control circuit having a first input receiving a reference voltage and a second input receiving a representative common mode voltage from outputs of the differential amplifier;
    a second Miller stage comprising third and fourth transistors of a second polarity receiving output signals from said first stage; and
    an unlocking circuit connected between the representative common mode voltage and inputs of said second Miller stage for causing a short-circuit to ensure conduction of said third and fourth transistors for initiating start-up of the differential amplifier circuit.

2. A differential amplifier according to claim 1 wherein said first and second transistors comprise NMOS transistors; wherein said third and fourth transistors comprise PMOS transistors; and wherein said second Miller stage comprises two PMOS-type transistors connected to define a common source, having drains connected to outputs of the differential amplifier respectively, and having gates connected to respective corresponding outputs from said first stage.

3. A differential amplifier according to claim 2 wherein said unblocking device comprises two NMOS transistors each having a source, a drain and a gate; wherein the drains are connected to corresponding gates of said third and fourth PMOS transistors; wherein the sources are connected to the representative common mode voltage; and wherein the gates are connected to the reference voltage so as to render said unblocking device conductive when the common mode voltage is significantly smaller than the reference value.

4. A differential amplifier according to claim 3 further comprising a cascade stage connected between said first stage and second Miller stage.

5. A differential amplifier according to claim 4 wherein said cascade stage comprises two NPN bipolar transistors.

6. A differential amplifier according to claim 4 wherein said cascade stage comprises two NMOS transistors.

7. A differential amplifier according to claim 3 further comprising a resistive bridge for determining the representative common mode voltage and to set to conduction said third and fourth transistors.

8. A differential amplifier according to claim 1 wherein said first stage further comprises a pair of feedback resistors and a third current source; and wherein said first and second transistors comprise NMOS transistors having gates which receive input signals via said pair of feedback resistors, and having common sources connected to the third current source.

9. A differential amplifier according to claim 8 wherein said second Miller stage further comprises two additional current sources and respective capacitors connected thereto; and wherein said third and fourth transistors comprise PMOS transistor assembled as a common source and each connected to a respective additional current source and capacitor; and wherein drains of said third and fourth PMOS transistors are connected to respective differential amplifier outputs.

10. A differential amplifier according to claim 9 wherein said first and second current sources comprise fifth and sixth PMOS transistors being assembled with a common source and each having a drain connected to a corresponding drain of said first and second transistors and further having a gate controlled by said control circuit.

11. A differential amplifier according to claim 10 wherein said unblocking circuit comprises seventh and eighth NMOS transistors with a gate for receiving the reference voltage and for short-circuiting the representative common mode voltage and gates of said third and fourth transistors when the representative common mode voltage significantly goes below the reference voltage.

12. A differential amplifier according to claim 11 wherein said seventh and eighth transistors comprise NPN bipolar transistors.

13. A differential amplifier according to claim 1 wherein said first stage, said second Miller stage and said unblocking circuit are adapted for use in a data communication amplifier of ATM or XDSL-type.

14. An integrated circuit differential amplifier comprising:
  a first stage comprising
    first and second transistors of a first polarity connected together in a differential amplifier configuration,
    first and second current mirror sources for supplying current to said first and second transistors, respectively, and
    a control circuit having a first input receiving a reference voltage and a second input receiving a representative common mode voltage from outputs of the differential amplifier;
  a second Miller stage comprising third and fourth transistors of a second polarity receiving output signals from said first stage;
  a cascade stage connected between said first stage and second Miller stage; and
  an unlocking circuit connected between the representative common mode voltage and inputs of said second Miller stage for causing a short-circuit to ensure conduction of said third and fourth transistors for initiating start-up of the differential amplifier circuit.

15. An integrated circuit differential amplifier according to claim 14 wherein said first and second transistors comprise NMOS transistors; wherein said third and fourth transistors comprise PMOS transistors; and wherein said second Miller stage comprises two PMOS-type transistors connected to define a common source, having drains connected to outputs of the differential amplifier respectively, and having gates connected to respective corresponding outputs from said first stage.

16. An integrated circuit differential amplifier according to claim 15 wherein said unblocking device comprises two NMOS transistors each having a source, a drain and a gate; wherein the drains are connected to corresponding gates of said third and fourth PMOS transistors; wherein the sources are connected to the representative common mode voltage; and wherein the gates are connected to the reference voltage so as to render said unblocking device conductive when the common mode voltage is significantly smaller than the reference value.

17. An integrated circuit differential amplifier according to claim 14 wherein said cascade stage comprises two NPN bipolar transistors.

18. An integrated circuit differential amplifier according to claim 14 wherein said cascade stage comprises two NMOS transistors.

19. An integrated circuit differential amplifier according to claim 14 further comprising a resistive bridge for determining the representative common mode voltage and to set to conduction said third and fourth transistors.

20. An integrated circuit differential amplifier according to claim 14 wherein said first stage further comprises a pair of feedback resistors and a third current source; and wherein said first and second transistors comprise NMOS transistors having gates which receive input signals via said pair of feedback resistors, and having common sources connected to the third current source.

21. An integrated circuit differential amplifier according to claim 20 wherein said second Miller stage further comprises two additional current sources and respective capacitors connected thereto; and wherein said third and fourth transistors comprise PMOS transistor assembled as a common source and each connected to a respective additional current source and capacitor; and wherein drains of said third and fourth PMOS transistors are connected to respective differential amplifier outputs.

22. An integrated circuit differential amplifier according to claim 21 wherein said first and second current sources comprise fifth and sixth PMOS transistors being assembled with a common source and each having a drain connected to a corresponding drain of said first and second transistors and further having a gate controlled by said control circuit.

23. An integrated circuit differential amplifier according to claim 22 wherein said unblocking circuit comprises seventh and eighth NMOS transistors with a gate for receiving the reference voltage and for short-circuiting the representative common mode voltage and gates of said third and fourth transistors when the representative common mode voltage significantly goes below the reference voltage.

24. An integrated circuit differential amplifier according to claim 23 wherein said seventh and eighth transistors comprise NPN bipolar transistors.

25. An integrated circuit differential amplifier according to claim 14 wherein said first stage, said second Miller stage and said unlocking circuit are adapted for use in a data communication amplifier of ATM or XDSL-type.

26. A method for providing unblocking in a differential amplifier comprising a first stage including first and second transistors of a first polarity connected together in a differential amplifier configuration, first and second current mirror sources for supplying current to said first and second transistors, respectively, and a control circuit having a first input receiving a reference voltage and a second input receiving a representative common mode voltage from outputs of the differential amplifier, the amplifier also comprising a second Miller stage comprising third and fourth transistors of a second polarity receiving output signals from said first stage, the method comprising:

using an unlocking circuit between the representative common mode voltage and inputs of said second Miller stage for causing a short-circuit to ensure conduction of said third and fourth transistors for initiating start-up of the differential amplifier circuit.

27. A method according to claim 26 wherein the unblocking device comprises two NMOS transistors each having a source, a drain and a gate; wherein the drains are connected to corresponding control terminals of said third and fourth transistors; wherein the sources are connected to the representative common mode voltage; and wherein the gates are connected to the reference voltage so as to render said unblocking device conductive when the common mode voltage is significantly smaller than the reference value.

28. A method according to claim 26 further comprising providing a cascade stage between said first stage and second Miller stage.

29. Method according to claim 26 further comprising using a resistive bridge for determining the representative common mode voltage and to set to conduction said third and fourth transistors.

30. A method according to claim 26 wherein said first and second current sources comprise fifth and sixth PMOS transistors being assembled with a common source and each having a drain connected to a corresponding conduction terminal of said first and second transistors and further having a gate controlled by said control circuit; and wherein said unblocking circuit comprises seventh and eighth NMOS transistors with a gate for receiving the reference voltage and for short-circuiting the representative common mode voltage and control terminals of said third and fourth transistors when the representative common mode voltage significantly goes below the reference voltage.

31. A method according to claim 26 wherein said first stage, said second Miller stage and said unlocking circuit are adapted for use in a data communication amplifier of ATM or XDSL-type.

* * * * *